(12) United States Patent
Wu et al.

(10) Patent No.: US 11,321,957 B2
(45) Date of Patent: May 3, 2022

(54) OPTICAL FINGERPRINT APPARATUS AND ELECTRONIC DEVICE

(71) Applicant: SHENZHEN GOODIX TECHNOLOGY CO., LTD., Shenzhen (CN)

(72) Inventors: Baoquan Wu, Shenzhen (CN); Dan Li, Shenzhen (CN); Jianxiang Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/891,037

(22) Filed: Jun. 2, 2020

(65) Prior Publication Data

US 2020/0327299 A1 Oct. 15, 2020

Related U.S. Application Data

(63) Continuation of application No. PCT/CN2019/110933, filed on Oct. 14, 2019.

(30) Foreign Application Priority Data

Apr. 10, 2019 (CN) .......................... 201920483758.3

(51) Int. Cl.
*G06V 40/13* (2022.01)
*G06V 40/12* (2022.01)
*H01L 27/146* (2006.01)

(52) U.S. Cl.
CPC ........ *G06V 40/12* (2022.01); *H01L 27/14685* (2013.01)

(58) Field of Classification Search
None
See application file for complete search history.

(56) References Cited

U.S. PATENT DOCUMENTS 9,831,282 B2 11/2017 Kim et al.
2005/0036665 A1 2/2005 Higuchi
(Continued)

FOREIGN PATENT DOCUMENTS

CN 104347527 A 2/2015
CN 104681454 A 6/2015
(Continued)

OTHER PUBLICATIONS

Wang, Zhijiang et al. "Optical Technology Handbook" (vol. two), pp. 274-279. China Machine Press, Aug. 31, 1994.
(Continued)

*Primary Examiner* — Joseph R Haley
(74) *Attorney, Agent, or Firm* — Scully Scott Murphy & Presser

(57) ABSTRACT

The present application provides an optical fingerprint apparatus and an electronic device, which could reduce a thickness of the optical fingerprint apparatus. The optical fingerprint apparatus is applied to an electronic device having a display screen and configured to be disposed under the display screen, and the optical fingerprint apparatus comprises: an optical fingerprint chip configured to receive a fingerprint detecting signal, wherein the fingerprint detecting signal is used to detect fingerprint information of a finger; and a filter structure, wherein the filter structure is deposited or sputtered on the optical fingerprint chip.

12 Claims, 3 Drawing Sheets

(56) References Cited

U.S. PATENT DOCUMENTS

| | | | |
|---|---|---|---|
| 2014/0138788 | A1 | 5/2014 | Kim et al. |
| 2015/0340399 | A1 | 11/2015 | Kim et al. |
| 2018/0083061 | A1 | 3/2018 | Kim et al. |
| 2019/0156094 | A1* | 5/2019 | Du .................. G06K 9/0004 |
| 2019/0180072 | A1* | 6/2019 | Fomani ............ G06K 9/00046 |

FOREIGN PATENT DOCUMENTS

| | | | |
|---|---|---|---|
| CN | 104933421 | A | 9/2015 |
| CN | 107944335 | A | 4/2018 |
| CN | 107958196 | A | 4/2018 |
| CN | 108962923 | A | 12/2018 |
| CN | 109016705 | A | 12/2018 |
| CN | 109033926 | A | 12/2018 |
| CN | 109190599 | A | 1/2019 |
| CN | 109313704 | A | 2/2019 |
| CN | 109376726 | A | 2/2019 |
| CN | 109416736 | A | 3/2019 |
| CN | 109576647 | A | 4/2019 |

OTHER PUBLICATIONS

Classification decision of general administration of customs—1999-2014 classification decision of Chinese Customs, Jul. 1, 2014, 3 pages with 1 page of translation.

* cited by examiner

OPTICAL FINGERPRINT APPARATUS AND ELECTRONIC DEVICE

CROSS-REFERENCE TO RELATED APPLICATIONS

This application is a continuation of International Application No. PCT/CN2019/110933, filed on Oct. 14, 2019, which claims priority to Chinese Patent Application No. 201920483758.3, filed on Apr. 10, 2019. The disclosures of the aforementioned applications are hereby incorporated by reference in their entireties.

TECHNICAL FIELD

The present application relates to the field of fingerprint identification technologies, and more particularly, to an optical fingerprint apparatus and an electronic device.

BACKGROUND

With the development of full-screen technology of mobile phones, a fingerprint identification module needs to be disposed under a screen. However, space under the screen is limited, which has raised higher requirements on a size and a spacial thickness of the fingerprint identification module.

Main components of a current mainstream optical fingerprint module are a lens, a filter, an optical fingerprint chip and the like, where the filter is formed by depositing a filter layer on a glass substrate material. The larger a screen is, the larger the filter is required. If a thinner glass substrate is used, it is very easy to be fragmented during a preparation process, resulting in a low yield of products. Therefore, an optical fingerprint apparatus for large-area fingerprint identification usually adopts a glass substrate with a thickness more than 200 μm, which increases a thickness of the entire optical fingerprint apparatus.

SUMMARY

The present application provides an optical fingerprint apparatus, which could reduce a thickness of the optical fingerprint apparatus.

In a first aspect, provided is an optical fingerprint apparatus, the optical fingerprint apparatus is applied to an electronic device having a display screen and configured to be disposed under the display screen, and the optical fingerprint apparatus includes:

an optical fingerprint chip configured to receive a fingerprint detecting signal, where the fingerprint detecting signal is used to detect fingerprint information of a finger;

a filter structure, where the filter structure is deposited or sputtered on the optical fingerprint chip.

In some possible implementation manners, the filter structure includes a first filter layer, the first filter layer includes a plurality of sub-layers, and the plurality of sub-layers are in a range from 10 layers to 200 layers.

In some possible implementation manners, the plurality of sub-layers include oxide layers of silicon and oxide layers of titanium.

In some possible implementation manners, a thickness of the first filter layer is less than 20 μm.

In some possible implementation manners, the filter structure includes:

a second filter layer deposited or sputtered on the optical fingerprint chip;

a support layer deposited or sputtered on the second filter layer; and a third filter layer deposited or sputtered on the support layer.

In some possible implementation manners, the second filter layer includes a plurality of first sub-layers, and the plurality of first sub-layers are in a range from 10 layers to 200 layers; and the second filter layer includes a plurality of second sub-layers, and the plurality of second sub-layers are in a range from 10 layers to 200 layers.

In some possible implementation manners, the plurality of first sub-layers include oxide layers of silicon and oxide layers of titanium, and the plurality of second sub-layers include oxide layers of silicon and oxide layers of titanium.

In some possible implementation manners, a thickness of the support layer is within 10 μm.

In some possible implementation manners, transmittance of the support layer to an optical signal is greater than 80%.

In some possible implementation manners, a thickness of the filter structure is not more than 20 μm.

In some possible implementation manners, the filter structure is deposited or sputtered on a sensing array of the optical fingerprint chip.

In a second aspect, provided is an optical fingerprint apparatus, including:

an optical fingerprint chip configured to receive a fingerprint detecting signal, where the fingerprint detecting signal is used to detect fingerprint information of a finger;

a transparent substrate disposed on the optical fingerprint chip, where a thickness of the transparent substrate is not more than 50 μm; and a filter structure, where the filter structure is deposited or sputtered on the transparent substrate.

In some possible implementation manners, the filter structure includes a plurality of sub-layers, and the plurality of sub-layers are in a range from 10 layers to 200 layers.

In some possible implementation manners, the plurality of sub-layers include oxide layers of silicon and oxide layers of titanium.

In some possible implementation manners, the transparent substrate is a glass substrate or a crystal substrate.

In some possible implementation manners, the optical fingerprint apparatus further includes:

an adhesive layer used to connect the optical fingerprint chip and the transparent substrate.

In a third aspect, provided is an electronic device, including: a display screen and the optical fingerprint apparatus in the first aspect or any possible implementation manner of the first aspect, where the optical fingerprint apparatus is disposed under the display screen.

In a fourth aspect, provided is an electronic device, including: a display screen and the optical fingerprint apparatus in the second aspect or any possible implementation manner of the second aspect, where the optical fingerprint apparatus is disposed under the display screen.

Therefore, according to an optical fingerprint apparatus of embodiments of the present application, a filter structure may be directly prepared on an optical fingerprint chip, and a glass substrate with a relatively great thickness is eliminated, which is beneficial to reduction of the overall thickness of the optical fingerprint apparatus.

DESCRIPTION OF EMBODIMENTS

Technical solutions in embodiments of the present disclosure will be described below with reference to the accompanying drawings.

As a common application scenario, an optical fingerprint system provided in an embodiment of the present application may be applied to a smart phone, a tablet computer, and other mobile terminals having a display screen or other terminal devices. More specifically, in the foregoing terminal device, a fingerprint identification apparatus may be specifically an optical fingerprint apparatus, which may be disposed in a partial region or an entire region under a display screen, thereby forming an under-screen (Under-display) optical fingerprint system.

Figure 1A:
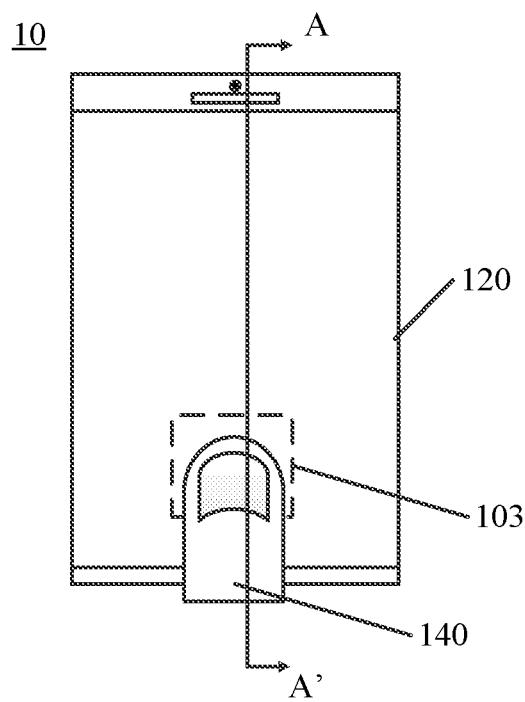
FIG. 1A is a schematic plan view of an electronic device to which the present application is applicable.
Figure 1B:
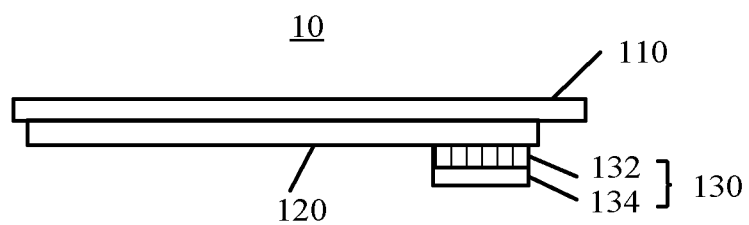
FIG. 1B is a partial schematic cross-sectional view of the electronic device shown in FIG. 1A taken along A-A'.

FIG. 1A and FIG. 1B are schematic views showing an electronic device to which an embodiment of the present application is applicable. FIG. 1A is a schematic front view of an electronic device 10, and FIG. 1B is a partial schematic cross-sectional structural view of the electronic device 10 shown in FIG. 1A taken along A-A'.

As shown in FIG. 1A and FIG. 1B, the electronic device 10 includes a display screen 120 and an optical fingerprint apparatus 130, where the optical fingerprint apparatus 130 is disposed in a partial region under the display screen 120, for example, under a middle region of the display screen. The optical fingerprint apparatus 130 includes an optical fingerprint sensor including a sensing array having a plurality of optical sensing units, and a region where the sensing array is located or its sensing region is a fingerprint detecting region 103 of the optical fingerprint apparatus 130. As shown in FIG. 1A, the fingerprint detecting region 103 is located in a display region of the display screen 120.

It should be understood that an area of the fingerprint detecting region 103 may be different from an area of the sensing array of the optical fingerprint apparatus 130. For example, the area of the fingerprint detecting region 103 of the optical fingerprint apparatus 130 may be larger than the area of the sensing array of the optical fingerprint apparatus 130 through for example, a lens imaging light path design, a reflective folding light path design or other light path designs such as light convergence or reflection. In other alternative implementation manners, if the light path is directed in a manner of, for example, light collimation, the area of the fingerprint detecting region 103 of the optical fingerprint apparatus 130 may also be designed to be substantially identical with the area of the sensing array of the optical fingerprint apparatus 130.

Therefore, when a user needs to unlock the terminal device or perform other fingerprint verification, a fingerprint input may be implemented merely by pressing a finger on the fingerprint detecting region 103 located on the display screen 120. Since fingerprint detection may be implemented in the screen, there is no need to exclusively reserve space for a front surface of the electronic device 10 adopting the foregoing structure to set a fingerprint button (such as a Home button), so that a full screen solution may be adopted; that is, the display region of the display screen 120 may be substantially extended to the entire front surface of the electronic device 10.

As an optional implementation manner, as shown in FIG. 1A, the optical fingerprint apparatus 130 includes a light detecting portion 134 and an optical component 132. The light detecting portion 134 includes the sensing array, a readout circuit and other auxiliary circuits electrically connected to the sensing array, which is fabricated in a die by a semiconductor process such as an optical imaging chip or an optical fingerprint sensor. The sensing array is specifically a photo detector array including a plurality of photo detectors distributed in an array, and the photo detectors may be used as the optical sensing units as described above. The optical component 132 may be disposed above the sensing array of the light detecting portion 134, and may specifically include a light directing layer or a light path directing structure, and other optical elements, and the light directing layer or light path directing structure is mainly used to direct reflected light reflected from a finger surface to the sensing array for optical detection.

In specific implementation, the optical component 132 and the light detecting portion 134 may be encapsulated in the same optical fingerprint assembly. For example, the optical component 132 may be encapsulated with the optical detecting portion 134 in the same optical fingerprint chip, or the optical component 132 may be disposed outside the chip where the optical detecting portion 134 is located, for example, the optical component 132 is attached above the chip, or some elements of the optical component 132 are integrated into the chip.

The light directing layer or light path directing structure of the optical component 132 has various implementations. For example, the light directing layer may be specifically a collimator layer made of a semiconductor silicon wafer, which has a plurality of collimating units or micro-hole arrays, and the collimating units may specifically be holes. Light among the reflected light reflected from the finger which is vertically incident to the collimating unit may pass through the hole and be received by the optical sensing unit below it. However, light with an excessive incident angle is attenuated through multiple reflections inside the collimating unit. Therefore, each optical sensing unit may basically only receive the reflected light reflected from the fingerprint directly above the optical sensing unit, and thus the sensing array may detect a fingerprint image of the finger.

In another embodiment, the light directing layer or the light path directing structure may also be an optical lens layer having one or more lens units, for example, a lens group composed of one or more aspheric lenses, for converging reflected light reflected from the finger to the sensing array of the light detecting portion 134 below it, so that the sensing array may perform imaging based on the reflected light so as to obtain a fingerprint image of the finger. Optionally, the optical lens layer may be provided with a pinhole in a light path of the lens unit, and the pinhole may cooperate with the optical lens layer to expand the field of view of the optical fingerprint apparatus, to improve a fingerprint imaging effect of the optical fingerprint apparatus 130.

In other embodiments, the light directing layer or the light path directing structure may also specifically adopt a micro-lens layer having a micro-lens array constituted by a plurality of micro-lenses, which may be formed above the sensing array of the light detecting portion 134 by a semiconductor growth process or other processes, and each micro-lens may correspond to one of the sensing units in the sensing array respectively. Furthermore, other optical film layers such as a medium layer or a passivation layer, may be formed between the micro-lens layer and the sensing unit, and more specifically, a light shielding layer having a micro-hole may also be formed between the micro-lens layer and the sensing unit, where the micro-hole is formed between the corresponding micro-lens and the sensing unit, and the light shielding layer may shield optical interference between adjacent micro-lenses and the sensing units, such that light corresponding to the sensing unit is converged to the interior of the micro-hole through the micro-lens and is transmitted to the sensing unit via the micro-hole for optical fingerprint imaging.

It should be understood that several implementations of the forgoing light path directing structure may be used alone or in combination, for example, a micro-lens layer may be further disposed under the collimator layer or the optical lens layer. Certainly, when the collimator layer or the optical lens layer is used in combination with the micro-lens layer, the specific stacked structure or light path may require to be adjusted according to actual needs.

As an optional embodiment, the display screen 120 may adopt a display screen having a self-light-emitting display unit, for example, an organic light-emitting diode (OLED) display screen or a micro light-emitting diode (Micro-LED) display screen. In an example of an OLED display screen, the optical fingerprint apparatus 130 may use a display unit (that is, an OLED light source) of the OLED display screen 120 located in the fingerprint detecting region 103 as an excitation light source for optical fingerprint detection. When a finger is pressed against the fingerprint detecting region 103, the display screen 120 emits a beam of light to the target finger above the fingerprint detecting region 103, and the light is reflected by a surface of the finger to form reflected light or form scattered light after scattering inside the finger. In related patent applications, the reflected light and the scattered light are collectively referred to as reflected light for convenience of description. Since a ridge and a valley of a fingerprint have different light reflecting capabilities, reflected light from the ridge of the fingerprint and reflected light from the valley of the fingerprint have different light intensities. After passing through the optical component, the reflected light is received by the sensing array in the optical fingerprint apparatus 130 and converted into a corresponding electrical signal, that is, a fingerprint detecting signal; and fingerprint image data may be obtained based on the fingerprint detecting signal, and fingerprint matching verification may be further performed, thereby implementing an optical fingerprint identification function at the electronic device 10. In other embodiments, the optical fingerprint apparatus 130 may also use an internal light source or an external light source to provide an optical signal for fingerprint detection.

It should be understood that, in specific implementation, the electronic device 10 further includes a transparent protective cover; and the cover may be a glass cover or a sapphire cover, which is located above the display screen 120 and covers a front surface of the electronic device 10. Therefore, in an embodiment of the present application, the so-called finger being pressed against the display screen 120 actually refers to the finger being pressed against the cover above the display screen 120 or a surface of a protective layer covering the cover.

On the other hand, in some embodiments, the optical fingerprint apparatus 130 may only include one optical fingerprint sensor, and in this case, the fingerprint detecting region 103 of the optical fingerprint apparatus 130 has a smaller area and a fixed position, and therefore, when an fingerprint input is performed, the user needs to press the finger at a specific position of the fingerprint detecting region 103, otherwise the optical fingerprint apparatus 130 may not be able to capture the fingerprint image, thereby resulting in poor user experience. In other alternative embodiments, the optical fingerprint apparatus 130 may specifically include a plurality of optical fingerprint sensors which may be disposed in a middle region of the display screen 120 side by side in a splicing manner, and sensing regions of the plurality of optical fingerprint sensors collectively constitute the fingerprint detecting region 103 of the optical fingerprint apparatus 130. In other words, the fingerprint detecting region 103 of the optical fingerprint apparatus 130 may include a plurality of sub-regions, each sub-region corresponding to a sensing region of one of the optical fingerprint sensors, so that the fingerprint capturing region 103 of the optical fingerprint module 130 may be extended to a main region of a middle portion of the display screen, that is, it is extended to a region generally pressed against by the finger, thereby achieving a blind pressing type of a fingerprint input operation. Alternatively, when the number of the optical fingerprint sensors is sufficient, the fingerprint detecting region 130 may also be extended to a half of the display region or even the entire display region, thereby achieving half-screen or full-screen fingerprint detection.

Figure 2:
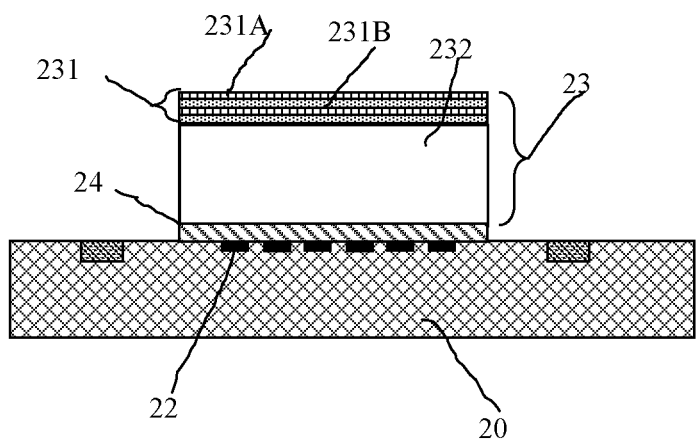
FIG. 2 is a schematic diagram of a stacked structure of an optical fingerprint apparatus.

In some cases, a filter may be disposed on an optical fingerprint chip and configured to filter out ambient light penetrating the finger, such as infrared light interfering with imaging. FIG. 2 is schematic diagram of a stacked structure of an optical fingerprint chip and a filter. As shown in FIG. 2, in this stacked structure, an optical filter 23 is disposed on an optical sensing chip 20, and the optical sensing chip 20 and the optical filter 23 are bonded by an optical adhesive 24. The optical filter 23 includes a glass substrate 232, and a plurality of stacked layers are deposited on a surface of the glass substrate 232, including a filter layer 231A and a filter layer 231B.

Due to the characteristics of the glass substrate, a thickness of the glass substrate 232 that is usable to the optical fingerprint apparatus is generally about 200 μm. If a thinner glass substrate with a level of 100 μm is used, with the development of a full screen, the under-screen optical fingerprint apparatus has evolved to have a large area, and a size of the optical filter needs to increase. In a case that an area of the optical filter is larger, the glass substrate with the level of 100 μm is very easy to be fragmented during production and operation processes, resulting in a low yield of products. It can be seen that a thickness of the entire optical filter 23 is greater than 200 μm. In some cases, if an optical component in the optical fingerprint apparatus adopts a micro-lens array, since the optical filter 23 shown in FIG. 2 is thicker, a micro-lens array 26 must be fabricated on a pixel array 22 on a surface of the optical sensing chip 20, as shown in FIG. 3.

Figure 3:
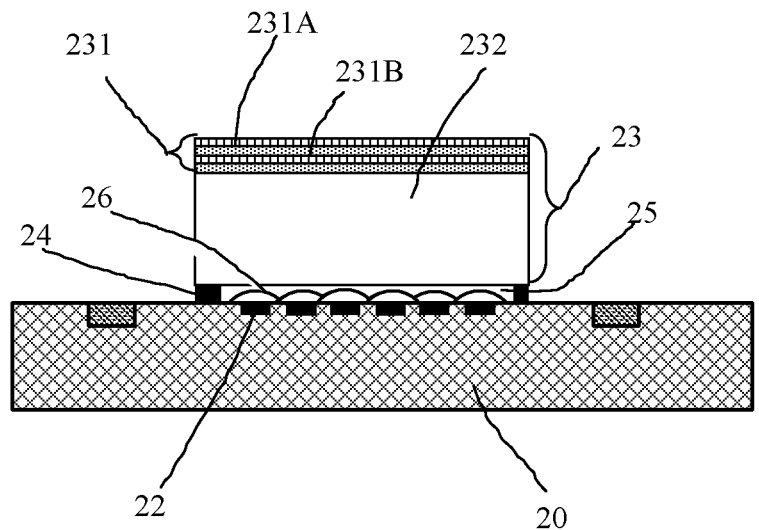
FIG. 3 is a schematic diagram of a stacked structure of another optical fingerprint apparatus.

It can be seen from FIG. 3 that due to the existence of the micro-lens array 26, support needs to be formed around the optical filter 23 by the adhesive 24 to leave a gap layer 25 between a bottom of the optical filter 23 and a surface of the pixel array 22 so that the micro-lens array 26 is disposed in the gap layer 25.

With the development of the full screen, the under-screen optical fingerprint apparatus has evolved to have a large area, an area of the micro-lens array 26 also increases, and an area of the optical filter 23 has to increase. In this way, there is a very large suspension area in the gap layer 25. With the extremely limited support structure (that is, the adhesive layer 24), a problem of mechanical reliability very easily occurs for the optical fingerprint apparatus, and needs of a terminal cannot be met.

In view of this, an embodiment of the present application provides an optical fingerprint apparatus in which a filter is integrated, which could reduce a thickness of the optical fingerprint apparatus, and is applicable to a terminal with a higher requirement on size, while guaranteeing mechanical reliability of the optical fingerprint apparatus.

Figure 4:
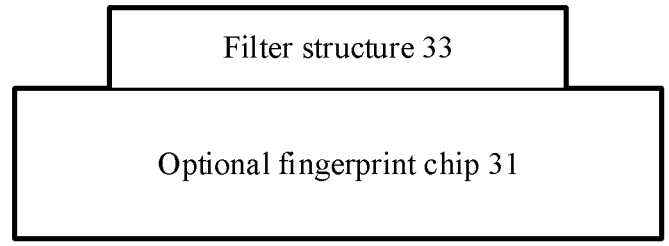
FIG. 4 is a schematic diagram of an optical fingerprint apparatus according to an embodiment of the present application.

FIG. 4 is a schematic structural diagram of an optical fingerprint apparatus according to an embodiment of the present application. An optical fingerprint apparatus 300 may be applied to an electronic device having a display screen, and the optical fingerprint apparatus is configured to be disposed under the display screen. As shown in FIG. 4, the optical fingerprint apparatus 300 includes:

an optical fingerprint chip 31 configured to receive a fingerprint detecting signal, where the fingerprint detecting signal is used to detect fingerprint information of a finger; and a filter structure 33, where the filter structure 33 is deposited or sputtered on the optical fingerprint chip 31.

Therefore, according to an optical fingerprint apparatus of the embodiment of the present application, a filter structure may be directly prepared on an optical fingerprint chip, that is, the optical fingerprint chip is used as a substrate, and a glass substrate with a relatively great thickness is eliminated, which is beneficial to reduction of the overall thickness of the optical fingerprint apparatus.

It should be understood that the fingerprint detecting signal may correspond to the fingerprint detecting signal in the embodiments shown in FIG. 1A and FIG. 1B, and the fingerprint detecting signal may be an optical signal returned by reflection or scattering via a human finger on the display screen, which will not be repeatedly described here.

Optionally, in the embodiment of the present application, the filter structure 33 may be integrated on the optical fingerprint chip 31 by using a preparation process such as a deposition process or a sputtering process, and a glass substrate could be eliminated. Moreover, the filter structure uses the optical fingerprint chip as a support structure, which could guarantee mechanical reliability of the optical fingerprint application. The following is described by an example of the deposition process, but it should not intended to impose any limitation on the embodiment of the present application.

In some specific embodiments, the filter structure 33 is integrated on a sensing array of the optical fingerprint chip 31.

Figure 5:
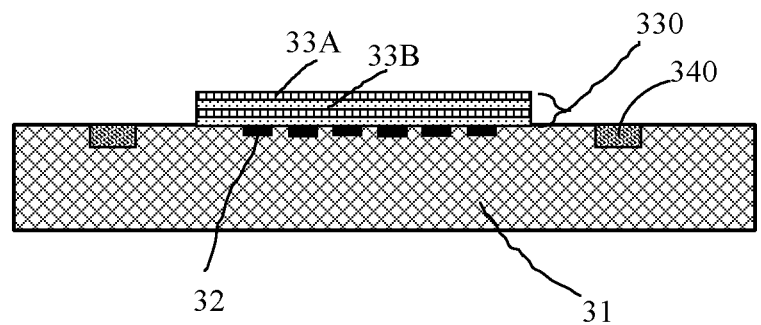
FIG. 5 is a schematic structural diagram of an optical fingerprint apparatus according to an embodiment of the present application.

Optionally, as an embodiment, which is denoted as an embodiment 1, as shown in FIG. 5, the filter structure 33 includes a first filter layer 330, the first filter layer 330 includes a plurality of sub-layers, such as 33A and 33B shown in FIG. 5, and the number of the layers shown in FIG. 5 is merely an example and is not limited.

Optionally, in some embodiments, the plurality of sub-layers are in a range from 10 layers to 200 layers.

Optionally, in some embodiments, the plurality of sub-layers include oxide layers of silicon and oxide layers of titanium. That is, the sub-layer 33A and the sub-layer 33B may be oxide layers of silicon or oxide layers of titanium.

Therefore, in the embodiment of the present application, the first filter layer 330 is directly prepared on the optical fingerprint chip 31, a glass substrate with a relatively great thickness is eliminated, and a thickness of the first filter layer may be made less than 20 μm, which greatly reduces a thickness of the filter layer and further reduces the thickness of the optical fingerprint apparatus.

Specifically, during a preparation process, the first filter layer 330 may be deposited on a surface of the optical fingerprint chip 31. In this way, the first filter layer 330 would cover the entire surface of the optical sensing chip 31, and a region where a sensing array 32 is located and a region where a pad 340 is located are included. Then, a filter layer covering a surface of the pad 340 or other locations at which the filter layer is not needed may be removed by means of etching.

Figure 6:
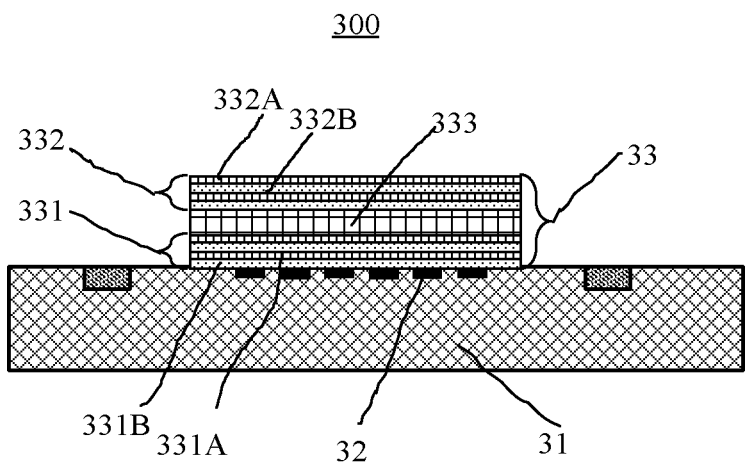
FIG. 6 is a schematic structural diagram of an optical fingerprint apparatus according to another embodiment of the present application.

Optionally, as an embodiment, which is denoted as an embodiment 2, as shown in FIG. 6, the filter structure 33 includes:

a second filter layer 331 deposited or sputtered on the optical fingerprint chip 31;

a support layer 333 deposited or sputtered on the second filter layer 331; and a third filter layer 332 deposited or sputtered on the support layer 333, where the support layer 333 is configured to support the third filter layer 332.

In comparison with the embodiment 1, in the embodiment 2, the support layer 333 is disposed on the second filter layer 331. In this way, more filter layers may be disposed on the support layer 333, such as the third filter layer and a fourth filter layer, so as to achieve a better filtering effect.

Optionally, in some embodiments, a thickness of the support layer 333 is within 10 μm.

Optionally, in some embodiments, a thickness of the support layer 333 is greater than 5 μm, which could ensure that the support layer has a sufficient thickness to provide a sufficient supporting function.

Optionally, in some embodiments, the second filter layer 331 may also include a plurality of first sub-layers, such as a first sub-layer 331A and a first sub-layer 331B shown in FIG. 6. It should be understood that the number of the sub-layers shown in FIG. 6 is merely an example and is not limited.

Optionally, the plurality of first sub-layers are in a range from 10 layers to 200 layers.

Optionally, in some embodiments, the third filter layer 332 include a plurality of second sub-layers, such as 332A and 332B shown in FIG. 6.

Optionally, the plurality of second sub-layers are in a range from 10 layers to 200 layers.

Optionally, in some embodiments, the plurality of first sub-layers include oxide layers of silicon and oxide layers of titanium, that is, 331A and 331B may be oxide layers of silicon or oxide layers of titanium.

Optionally, in some embodiments, the plurality of second sub-layers include oxide layers of silicon and oxide layers of titanium, that is, 332A and 332B may be oxide layers of silicon or oxide layers of titanium.

Optionally, in some embodiments, the support layer 333 has a certain transmittance to an optical signal. For example, the transmittance of the support layer 333 to an optical signal is greater than 80%, 90%, or the like.

Therefore, in the embodiment of the present application, the second filter layer 331 is directly prepared on the optical fingerprint chip 31, the support layer 333 is further prepared on the second filter layer 331, then more filter layers are prepared on the support layer 333, and a glass substrate with a relatively great thickness is eliminated, so that a thickness of the filter structure may be made less than 20 µm, which greatly reduces the thickness of the filter layer, and more filter layers can be prepared by setting the support layer, which improves the filtering effect.

In the embodiment 2, the second filter layer 331 may be deposited on the surface of the optical fingerprint chip 31, then the support layer 333 is deposited on a surface of the second filter layer, and more filter layers are further deposited on a surface of the support layer 333, such as the third filter layer 332. Similar to the embodiment 1, after the foregoing filter layers are prepared, the filter layers would cover the entire surface of the optical sensing chip 31, and further, filter layers covering the surface of the pad or other locations at which the filter layers are not needed may be removed by means of etching. Finally, the filter structure 33 is formed on the surface of the optical fingerprint chip 31.

Further, if the optical fingerprint apparatus adopts a micro-lens array as a light directing component, after the filter structure 33 is prepared, optical components such as a light shielding layer and a micro-lens array may be further prepared on the filter structure 33.

Figure 7:
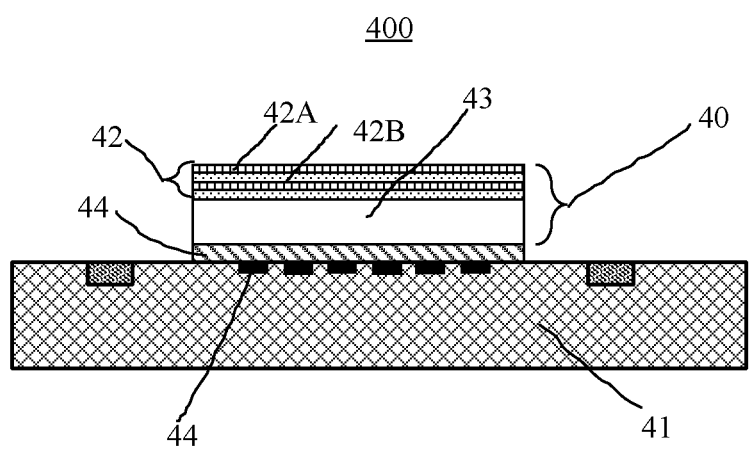
FIG. 7 is a schematic structural diagram of an optical fingerprint apparatus according to yet another embodiment of the present application.

FIG. 7 is a schematic structural diagram of an optical fingerprint apparatus according to another embodiment of the present application. As shown in FIG. 7, an optical fingerprint apparatus 400 includes:

an optical fingerprint chip 41 configured to receive a fingerprint detecting signal, where the fingerprint detecting signal is used to detect fingerprint information of a finger;

a transparent substrate 43 disposed on the optical fingerprint chip 41, where a thickness of the transparent substrate is not more than 50 µm; and a filter structure 42, where the filter structure 42 is deposited or sputtered on the transparent substrate 43.

Optionally, in the embodiment of the present application, the transparent substrate 43 may be a substrate of a transparent material such as glass or crystal, which is not limited in the embodiment of the present application.

In a specific embodiment, a thickness of the transparent substrate is in a range from 30 µm to 100 µm.

Optionally, in the embodiment of the present application, the filter structure 42 includes a plurality of sub-layers, such as 42A and 42B shown in FIG. 7.

Optionally, the plurality of sub-layers are in a range from 10 layers to 200 layers.

Optionally, in the embodiment of the present application, the plurality of sub-layers include oxide layers of silicon and oxide layers of titanium.

It should be understood that, in this embodiment, the filter structure 42 may also adopt the filter structure 33 in the foregoing described embodiments, which will not repeatedly described here for brevity.

Optionally, in some embodiments, the optical fingerprint apparatus 400 further includes:

an adhesive layer 44 used to connect the optical fingerprint chip and the transparent substrate.

It should be understood that, in this embodiment, the transparent substrate 43 is prepared on the optical fingerprint chip 41 first, and further, the filter structure is prepared on a surface of the transparent substrate 43. Therefore, the transparent substrate 43 may use a thinner substrate material, such as a glass substrate with a level of 100 µm, which could reduce a thickness of the optical fingerprint module to a certain extent.

A preparation method of the optical fingerprint apparatus 400 will be described below by an example of a glass substrate with reference to FIG. 7.

First, the glass substrate 43 is adhered on the optical fingerprint chip 41 by the adhesive layer 44, specifically on a sensing array 45 of the optical fingerprint chip 41.

Since the glass substrate 43 is adhered on the optical fingerprint chip 41 first, a thinner glass substrate may be used, such as thin glass with a thickness less than 50 µm.

Further, the filter structure 42 is deposited or sputtered on the glass substrate 43. In comparison with the case that the filer layer is deposited on a thicker glass substrate and then the thicker glass substrate is adhered on the surface of the optical fingerprint chip in FIG. 2, the thinner glass substrate could be used, which could reduce the thickness of the entire filter layer.

An embodiment of the present application further provides an electronic device, and the electronic device may include a display screen and an optical fingerprint apparatus, where the optical fingerprint apparatus is disposed under the display screen.

It should be understood that the optical fingerprint apparatus may be the optical fingerprint apparatus in the embodiments shown in FIG. 3 to FIG. 7. For specific description, reference may be made to the foregoing embodiments, which will not be repeatedly described here.

For the display screen, reference may be made to the related implementation manners regarding the display screen 120 in FIG. 1A or FIG. 1B, such as an OLED display screen or other display screens, which will not be repeatedly described herein for brevity.

It should be understood that specific examples in the embodiments of the present application are just for helping those skilled in the art better understand the embodiments of the present application, rather than for limiting the scope of the present application.

It should be understood that terms used in the embodiments of the present application and the claims appended hereto are merely for the purpose of describing particular embodiments, and are not intended to limit the embodiments of the present application. For example, the use of a singular form of "a", "the above" and "this" in the embodiments of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are performed by hardware or software depends on particular applications and designed constraint conditions of the technical solutions. Persons skilled in the art may use different methods to implement the described functions for each particular application, but it should not be considered that the implementation goes beyond the scope of the present application.

In the several embodiments provided in the present application, it should be understood that, the disclosed system and apparatus may be implemented in other manners. For example, the foregoing described apparatus embodiments are merely exemplary. For example, division of the units is merely logical function division and there may be other division manners in practical implementation. For example, multiple units or components may be combined or integrated into another system, or some features may be ignored or not executed. In addition, the displayed or discussed mutual coupling or direct coupling or communication connection may be indirect coupling or communication connection through some interfaces, apparatuses or units, and may also be electrical, mechanical, or connection in other forms.

The units described as separate components may or may not be physically separate, and components displayed as units may or may not be physical units, may be located in one position, or may be distributed on multiple network units. Part of or all of the units here may be selected according to a practical need to achieve the objectives of the solutions of the embodiments of the present application.

In addition, various functional units in the embodiments of the present application may be integrated into a processing unit, or each unit may exist alone physically, or two or more than two units may be integrated into one unit. The integrated unit may be implemented in a form of hardware, or may be implemented in a form of a software functional unit.

If the integrated unit is implemented in the form of the software functional unit and is sold or used as an independent product, it may be stored in a computer readable storage medium. Based on such understanding, the nature of the technical solutions of the present application, or the part contributing to the prior art, or all of or part of the technical solutions may be implemented in a form of a software product. The computer software product is stored in a storage medium and includes several instructions for instructing a computer device (which may be a personal computer, a server, network equipment or the like) to execute all of or part of the steps of the methods described in the embodiments of the present application. The storage medium includes: various media that may store program codes, such as a U-disk, a removable hard disk, a read-only memory (ROM, Read-Only Memory), a random access memory (RAM, Random Access Memory), a magnetic disk, a compact disk, and so on.

The foregoing descriptions are merely specific implementations of the present application. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims.

The foregoing descriptions are merely specific implementations of the present application. The protection scope of the present application, however, is not limited thereto. Changes or replacements may be readily conceivable to any person skilled in the art within the technical scope disclosed in the present application, and all of these shall fall within the protection scope of the present application. Therefore, the protection scope of the present application shall be subject to the protection scope of the claims.

What is claimed is:

1. An optical fingerprint apparatus, wherein the optical fingerprint apparatus is applied to an electronic device having a display screen and configured to be disposed under the display screen, and the optical fingerprint apparatus comprises:

an optical fingerprint chip configured to receive a fingerprint detecting signal, wherein the fingerprint detecting signal is used to detect fingerprint information of a finger; and a filter structure, wherein the filter structure is deposited or sputtered on the optical fingerprint chip, the optical fingerprint chip serving as a support structure of the filter structure, and a thickness of the filter structure being less than or equal to 20 µm.

2. The optical fingerprint apparatus according to claim 1, wherein the filter structure comprises a first filter layer, the first filter layer comprises a plurality of sub-layers, and the plurality of sub-layers are in a range from 10 layers to 200 layers.

3. The optical fingerprint apparatus according to claim 2, wherein the plurality of sub-layers comprise oxide layers of silicon and oxide layers of titanium.

4. The optical fingerprint apparatus according to claim 2, wherein a thickness of the first filter layer is less than or equal to 20 µm.

5. The optical fingerprint apparatus according to claim 1, wherein the filter structure comprises:

a second filter layer deposited or sputtered on the optical fingerprint chip;

a support layer deposited or sputtered on the second filter layer; and a third filter layer deposited or sputtered on the support layer, wherein the support layer is configured to support the third filter layer.

6. The optical fingerprint apparatus according to claim 5, wherein the second filter layer comprises a plurality of first sub-layers, and the plurality of first sub-layers are in a range from 10 layers to 200 layers; and the second filter layer comprises a plurality of second sub-layers, and the plurality of second sub-layers are in a range from 10 layers to 200 layers.

7. The optical fingerprint apparatus according to claim 6, wherein the plurality of first sub-layers comprise oxide layers of silicon and oxide layers of titanium, and the plurality of second sub-layers comprise oxide layers of silicon and oxide layers of titanium.

8. The optical fingerprint apparatus according to claim 5, wherein a thickness of the support layer is less than or equal to 10 µm.

9. The optical fingerprint apparatus according to claim 5, wherein transmittance of the support layer to an optical signal is greater than 80%.

10. The optical fingerprint apparatus according to claim 1, wherein the filter structure is deposited or sputtered on a sensing array of the optical fingerprint chip.

11. An electronic device comprising:

a display screen; and an optical fingerprint apparatus under the display screen, wherein the optical fingerprint apparatus comprises:

an optical fingerprint chip configured to receive a fingerprint detecting signal, wherein the fingerprint detecting signal is used to detect fingerprint information of a finger; and a filter structure, wherein the filter structure is deposited or sputtered on the optical fingerprint chip, the optical fingerprint chip serving as a support structure of the filter structure, and a thickness of the filter structure being less than or equal to 20 µm.

12. The electronic device according to claim 11, wherein the filter structure comprises a plurality of sub-layers, and the plurality of sub-layers are in a range from 10 layers to 200 layers.

* * * * *